(12) United States Patent
Jakobsson

(10) Patent No.: US 6,608,999 B1
(45) Date of Patent: Aug. 19, 2003

(54) COMMUNICATION SIGNAL RECEIVER AND AN OPERATING METHOD THEREFOR

(75) Inventor: Peter Jakobsson, Lund (SE)

(73) Assignee: Telefonaktiebolaget LM Ericsson (publ), Stockholm (SE)

(*) Notice: Subject to any disclaimer, the term of this patent is extended or adjusted under 35 U.S.C. 154(b) by 0 days.

(21) Appl. No.: 09/443,364

(22) Filed: Nov. 19, 1999

(30) Foreign Application Priority Data

Nov. 26, 1998  (SE) .............................. 9804060

(51) Int. Cl.[7] .................................. H04B 1/10
(52) U.S. Cl. ............... 455/303; 455/226.1; 455/226.2; 455/229; 455/421; 375/319
(58) Field of Search .................. 455/226.1, 226.2, 455/229, 421, 303, 343, 574, 296, 308, 310; 375/319, 346, 350

(56) References Cited

U.S. PATENT DOCUMENTS 4,101,839 A * 7/1978 Poole et al. ............... 327/355
4,979,230 A 12/1990 Marz ........................ 455/301
5,838,735 A 11/1998 Khullar ...................... 375/319
6,081,565 A * 6/2000 Marandi et al. ............ 333/128

FOREIGN PATENT DOCUMENTS

EP    0 863 606 A1    9/1998
WO    98/04050       1/1998

* cited by examiner

Primary Examiner—Dwayne Bost
Assistant Examiner—David Nguyen
(74) Attorney, Agent, or Firm—Nixon & Vanderhye P.C.

(57) ABSTRACT

A communication signal receiver has a plurality of components. The components are arranged along at least one signal path and comprise a filter (130a–b) for processing a received signal and averaging means (134a–b) for deriving a mean value of the signal. An output of the averaging means (134a–b) is connected to a component (128a–b) located prior to the filter (130a–b) along the signal path, so that the mean value may be selectively fed back to the filter (130a–b).

15 Claims, 4 Drawing Sheets

COMMUNICATION SIGNAL RECEIVER AND AN OPERATING METHOD THEREFOR

TECHNICAL FIELD

The present invention relates to a communication signal receiver with a plurality of components arranged along at least one signal path, where the components along the or each signal path comprise a filter for processing a received signal and averaging means for deriving a mean value of the signal. The invention also relates to a method of operating a communication signal receiver with a plurality of components arranged along at least one signal path, wherein a received signal is converted to a digital form and the signal is processed by at least one digital filter comprised in said plurality of components.

DESCRIPTION OF THE PRIOR ART

Communication signal receivers as set out above are used in e.g. wireless telecommunication devices, such as mobile telephones.

A generic communication signal receiver according to the prior art is shown in FIG. 4. The receiver is a homodyne receiver comprising dual communication channels, which are commonly known as I and Q channels. The dual-channel homodyne receiver of FIG. 4 is of a kind, which is frequently used in contemporary digital mobile telephones, such as GSM, DCS or PCS telephones.

The receiver comprises an antenna 400 for receiving an incoming electromagnetic communication signal, such as a TDMA signal ("Time Division Multiple Acces") representing a stream of digital data symbols, which have been modulated onto two orthogonal carrier waves. The received signal is fed through a bandpass filter 402, amplified in an amplifier 404 and then split into two identical signals in a splitter 406. The first of these signals goes to a first signal path, where it is initially mixed in a mixer 420*a* with an intermediate frequency signal. The intermediate frequency signal is fed from a local oscillator 410 and passes unmodified through a phase shifter 408. Similarly, the second signal goes to a second signal path, where it is mixed in a mixer 420*b* with the intermediate frequency signal from the local oscillator 410, once the phase of the intermediate frequency signal has been shifted by 90° in the phase shifter 408.

The output of the mixer 420*a* is filtered by a lowpass filter 422*a* and amplified in a second amplifier 424*a*. Subsequently, the signal is fed to an AD converter 426*a* for sampling the signal and converting it to a digital signal comprising aforesaid stream of data symbols. The digital signal is filtered in a digital lowpass filter 430*a*, and the digital data symbols contained in the signal are supplied, at a node 432*a*, to a digital memory 450. An average calculator 439*a* determines the mean value (DC level) of the digital signal and supplies the mean value to a negative input of an adder 440*a*. At a positive input the adder receives the digital data symbols, that were previously tapped from the signal path at node 432*a*. Thus, the adder 440*a* will in effect subtract the signal mean value, as determined by the average calculator 439*a*, from the digital signal.

Consequently, the output of the adder 440*a* at the end of the first signal path will finally provide a first part of the stream of digital data symbols, that were contained in and carried by the analog signal initially received at the antenna 400. Correspondingly, the second signal path, starting with a mixer 420*b* and ending with an adder 440*b*, will provide a second part of the stream of digital data. The stream of digital data symbols are subsequently used by other components in the mobile telephone for producing e.g. an audible output through a loudspeaker, such as speech from a party with which the user of the telephone is currently having a telephone conversation. Alternatively, the stream of digital data symbols may represent data messages sent between two computers during a data communication session.

PROBLEM

The use of digital filters 430*a–b* introduces a delay in the signal path, due to the inherent operational properties of digital filters, such as FIR (Finite Impulse Response) or IIR (Infinite Impulse Response) filters. Ideally, once the last wanted digital data symbol has been sampled, the components prior to the digital filters (such as the mixers 420*a–b*, the amplifiers 404*a–b*, 424*a–b* and the AD converters 426*a–b*) should be switched to a passive or idle mode, in order to preserve power and/or to enter a transmit mode as soon as possible.

However, switching off the receiver circuits immediately after the last wanted data symbol has been sampled causes transient noise from the digital filter, due to the rapid change in the DC level of the signal. Therefore, in order to avoid such generation of noise, it has been necessary for prior art receivers, like the generic one described above, to remain active for a certain period of time after the last wanted data symbol. By doing so, the digital filters are fed with a signal with essentially nonvarying DC-level for as long as it takes for the last symbol to pass through the digital filters. Obviously, this contradicts the above objective of allowing an immediate switch to a passive mode or transmit mode.

THE INVENTION

Therefore, it is an objective of the present invention to overcome the drawbacks of the prior art approach set out above. In particular, the purpose of the invention is to provide an improved communication signal receiver of the type having a plurality of components arranged along at least one signal path, the components along the or each signal path comprising a filter for processing a received signal and averaging means for deriving a mean value of the signal, where the improvements particularly lie in a more rapid switch from active to passive mode and reduced power consumption.

These objectives are achieved by connecting an output of the averaging means to a component located prior to the filter along the signal path, so that a mean value (or DC level) of the signal may be selectively fed back to the filter for a period of time immediately following the sampling of the last wanted data symbol. Since the filter will be supplied with a signal with no rapid change in DC level, the receiver circuits may be immediately switched off, after the last wanted data symbol has been sampled, without generating transient noise in the digital filter.

The objectives are also achieved by a method of operating the communication signal receiver, wherein a received signal is converted to a digital form and the signal is processed by at least one digital filter, by determining an average value of the signal, detecting an event in the signal, and in response thereof feeding the digital filter with the average value.

Other objectives, advantages and features of the present invention appear from the following detailed description, from the attached patent claims as well as from the drawings.

BRIEF DESCRIPTION OF THE DRAWINGS

Preferred and alternative embodiments of the present invention will now be described in more detail with reference to the accompanying drawings, in which.

DETAILED DISCLOSURE

Figure 1:
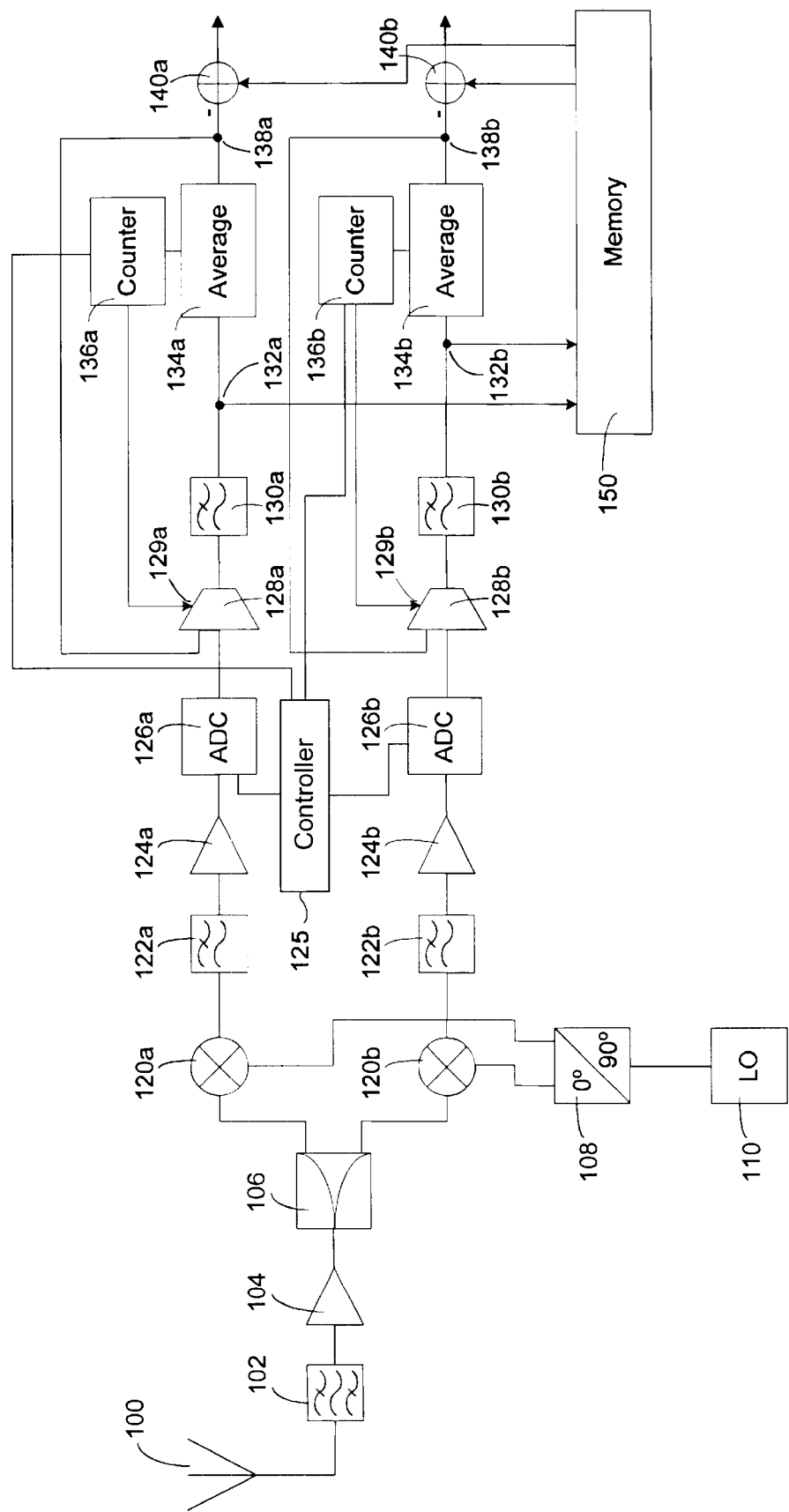
FIG. 1 is a schematic block diagram of a preferred embodiment of a communication signal receiver according to the present invention.
Figure 4:
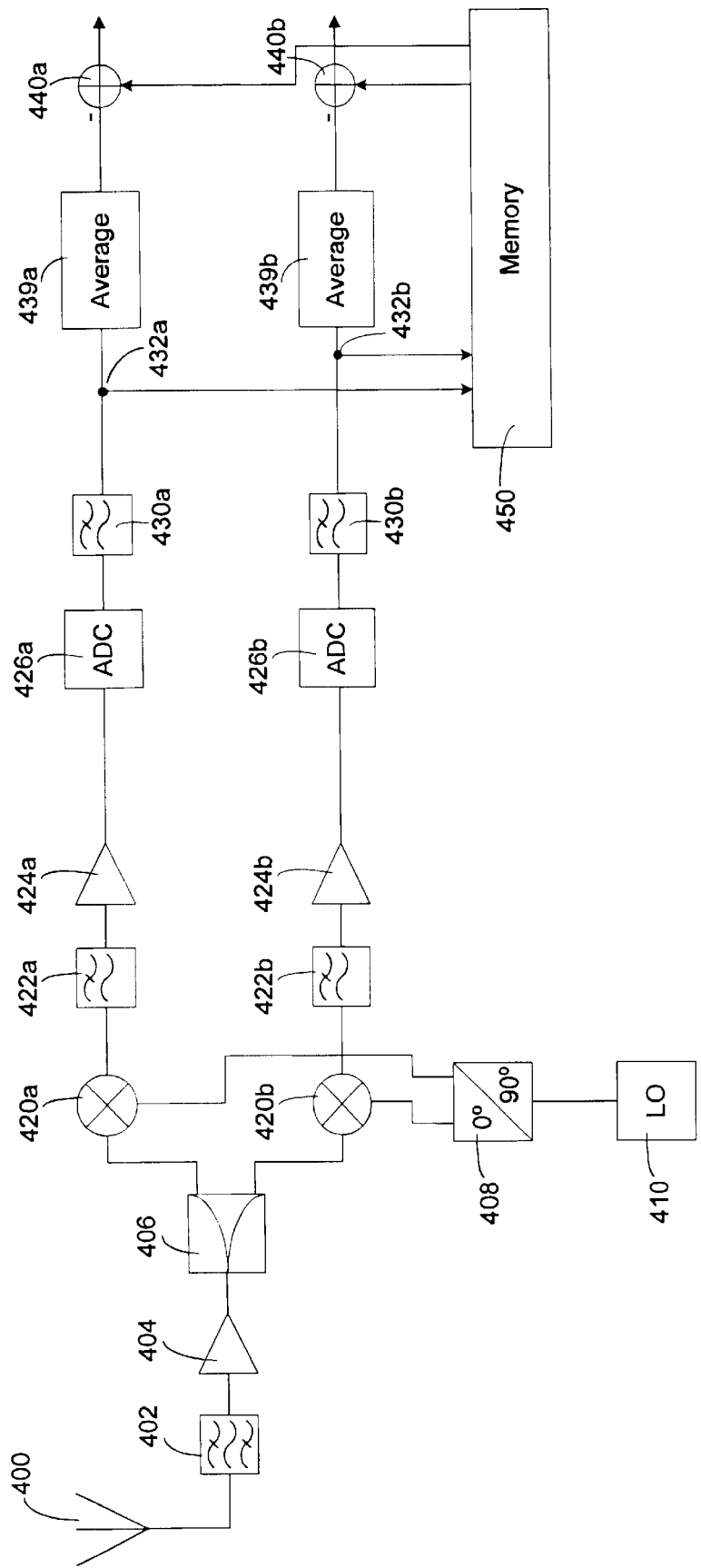
FIG. 4 is a schematic block diagram of a generic communication signal receiver according to the prior art.

FIG. 1 illustrates a preferred embodiment of a communication signal receiver according to the present invention. Much like the prior art receiver of FIG. 4, the preferred embodiment of FIG. 1 is a homodyne receiver with dual communication channels, which are commonly known as I and Q channels. The components of the receiver of FIG. 1 have been assigned a respective three-digit reference numeral from 100 to 150. All components having a reference numeral, the two rightmost digits of which are identical to the two rightmost digits of a corresponding component in the prior art receiver of FIG. 4, are identical or have essentially the same function as said corresponding component of FIG. 4. Consequently, the antenna 100, the bandpass filter 102, the amplifier 104, the splitter 106, the phase shifter 108, the local oscillator 110, the mixers 120 a–b, the lowpass filters 122a–b, the amplifiers 124a–b, the AD converters 126a–b, the digital filters 130a–b, the adders 140a–b and the memory 150 are all identical to, or have essentially the same function as, the antenna 400, bandpass filter 402, amplifier 404, etc. of the generic prior art receiver shown in FIG. 4.

Furthermore, the receiver of FIG. 1 comprises a first average calculator 134a in the first signal path as well as a second average calculator 134b in the second signal path.

Just like the average calculators 439a–b in the prior art receiver of FIG. 4, the average calculators 134a–b are arranged to receive, at input nodes 132a–b, the digital samples (as produced by the AD converters 128a–b and filtered by the digital filters 130a–b) and derive an average or mean value of a predetermined number of recently received samples. This value, which is a time-discrete digital moving average value, is supplied at output nodes 138a–b to the negative terminals of the adders 140a–b, in similarity with the prior art receiver of FIG. 4. Unlike the prior art receiver, the inventive receiver of FIG. 1 has a feedback loop starting at the respective node 138a–b and ending at a respective first input terminal of a respective data selector or multiplexor 128a–b, which is located between the respective AD converters 126a–b and digital filters 130a–b, as shown in FIG. 1. Furthermore, a counter 136a–b is connected to the respective average calculator 134a–b. An output of the counter 136a–b is connected to a respective control terminal 129a–b of the selector 128a–b. A second input terminal of the selector 128a–b is connected to the output of the respective AD converter 126a–b.

The operation of the average calculators 134a–b, the counters 136a–b and the selectors 128a–b is as follows. When the receiver is in a receive mode, i.e., receives and processes a plurality of digital data symbols as described above, the counter 136a controls the selector 128a, via the control terminal 129a, to forward the stream of digital data symbols received from the AD converter 126a to the digital filter 130a. Meanwhile, the average calculator 134a continuously calculates an average value of the last n numbers of digital data symbols, representing the DC level of the digital signal (n is a predetermined number of samples, such as 32–128). When it has been established, e.g., by controller means 125, that the last wanted digital data symbol has been sampled by the AD converter 126a, the counter 136a controls the selector 128a to instead start forwarding the average value calculated by the average calculator 134a to the digital filter 130a. During a predetermined number of symbol periods the counter 136a maintains the selector 128a in this state, wherein the average value fed back from node 138a is supplied to the digital filter 130a.

As is readily realized by the skilled person, the actual value of the predetermined number of symbol periods depends on the actual implementation of the digital filter 130a. Furthermore, it is common to use not only one digital filter 130a, but a series of digital filters, and the actual number of symbol periods will have to be decided after due consideration and testings. However, for one contemporary GSM receiver, 11 symbol periods have proven to be a suitable number for the time period, during which the digital filter 130a has to be fed with aforesaid average value in order to avoid transient noise in the digital filter.

Since the digital filter 130a inherently has a certain DC gain, the average calculator 134a is arranged to compensate for this DC gain by multiplying with the inverse thereof before supplying its output at node 138a.

Thanks to the provision of the average calculator 134a, the counter 136a and the feedback loop from node 138a to the selector 128a, the digital filter 130a is guaranteed to be fed with digital data having a "correct" mean value, i.e. a DC level which is essentially the same as the DC level of the last digital data symbols. Hence, transient noise is avoided in the digital filter, since the DC level of the digital signal exhibits no rapid change. Consequently, the receiver circuits prior to the digital filter 130a, e.g. the AD converter 126a, the amplifier 124a, the lowpass filter 122a, the mixer 120a, etc., may be switched to a passive or idle mode immediately after the last wanted data symbol has been sampled. This conserves power as well as facilitates an earlier switch to a transmit mode.

The above discussion of the operating principle of the components along the first signal path is applicable to the components along the second signal path, i.e. the second average calculator 134b, the second counter 136b, the second selector 128b, etc. As an alternative, since data symbols are received simultaneously and at equal rate on both signal paths, the first and second counters 136a–b may be combined into a single counter, which is shared between both signal paths.

Figure 2:
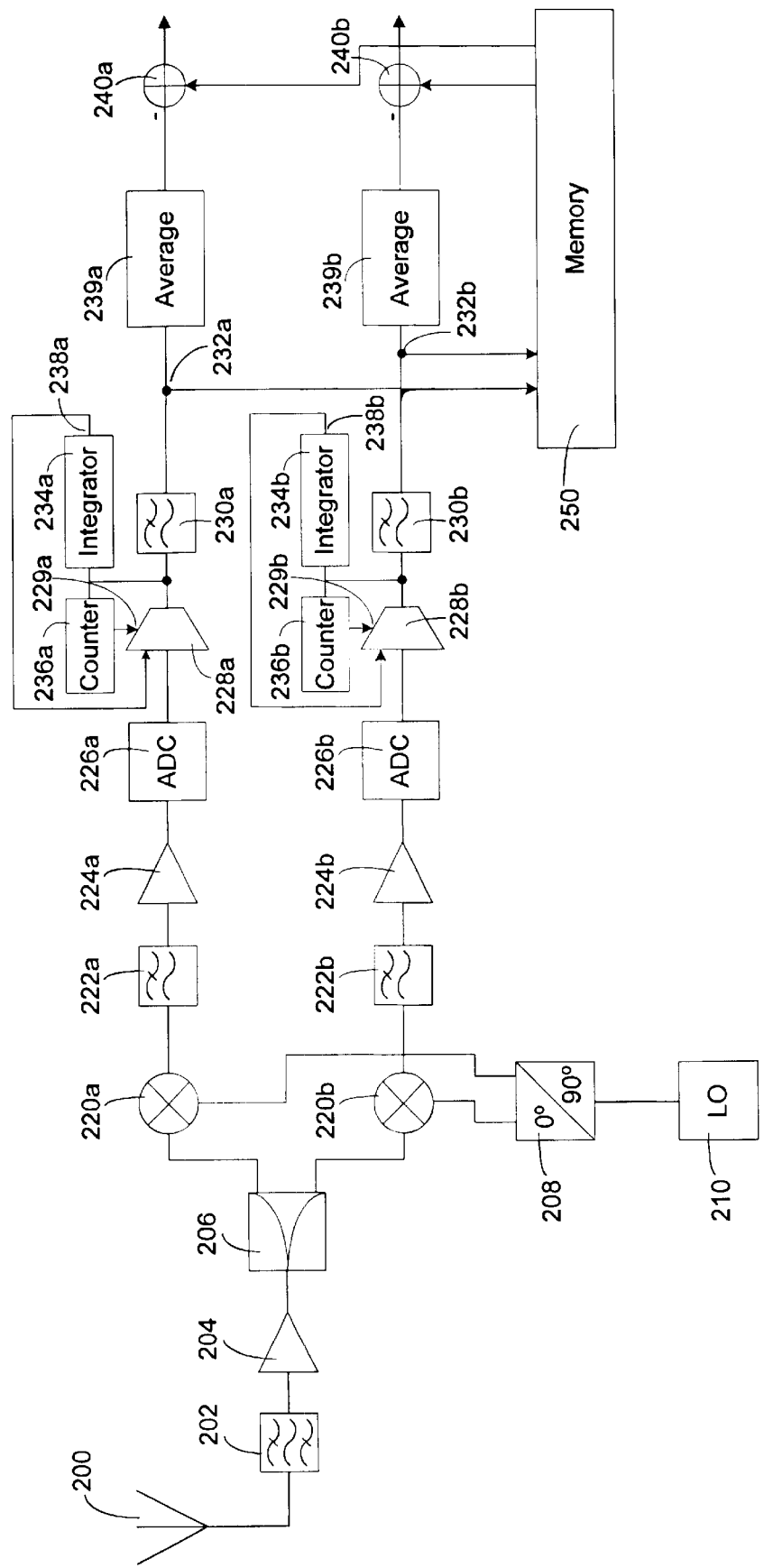
FIG. 2 is a schematic block diagram of a first alternative embodiment of the present invention.

An alternative embodiment of the inventive communication signal receiver is shown in FIG. 2. All components having a reference numeral, the last two digits of which are equal to the last two digits of a corresponding component in the prior art receiver of FIG. 4, are identical or have essentially the same function. In contrast to FIG. 1, the average calculators 239a–b of FIG. 2 have no means for feeding back a mean value to the digital filters 230a–b; the average calculators 239a–b only have their "normal" function as described above for the prior art receiver of FIG. 4. Instead, the embodiment of FIG. 2 comprises an integrator 234a–b for each signal path. The integrator 234a–b is connected to the respective signal path between a selector 228a–b and a digital filter 230a–b. The selector 228a–b is identical to or has the same function as the selector 128a–b described with reference to FIG. 1. Furthermore, the FIG. 2 embodiment comprises a counter 236a–b having an input connected to the respective integrator 234a–b. An output of the counter 236a–b is connected to a control terminal 229a–b of the respective selector 228a–b.

The purpose of the integrator 234a–b is to filter out the DC level (i.e. the average value) of the digital signal and to feed back this average value, via an output terminal 238a–b, to the selector 228a–b, once the last wanted digital data symbol has been sampled by the AD converter 226a–b. The integrator 234a–b may for instance be implemented as a filter having the following filter equation: $y(n)=\alpha y(n-1)+(1-\alpha)x(n)$, where $\alpha$ is a constant which has to be tuned and set in view of the actual application. However, other FIR or IIR filters with appropriate lowpass characteristics may be used instead of the simple integrator defined by the discrete differential equation above.

Consequently, the main operating principle of the embodiment of FIG. 2 is essentially the same as that of the FIG. 1 embodiment; an average value representing the DC level of the digital signal is derived and fed back to the digital filter 230a–b for a predetermined number of symbol periods immediately after the last wanted digital data symbol has been sampled, thereby avoiding rapid changes in the DC level of the signal and generation of unwanted transient noise.

Figure 3:
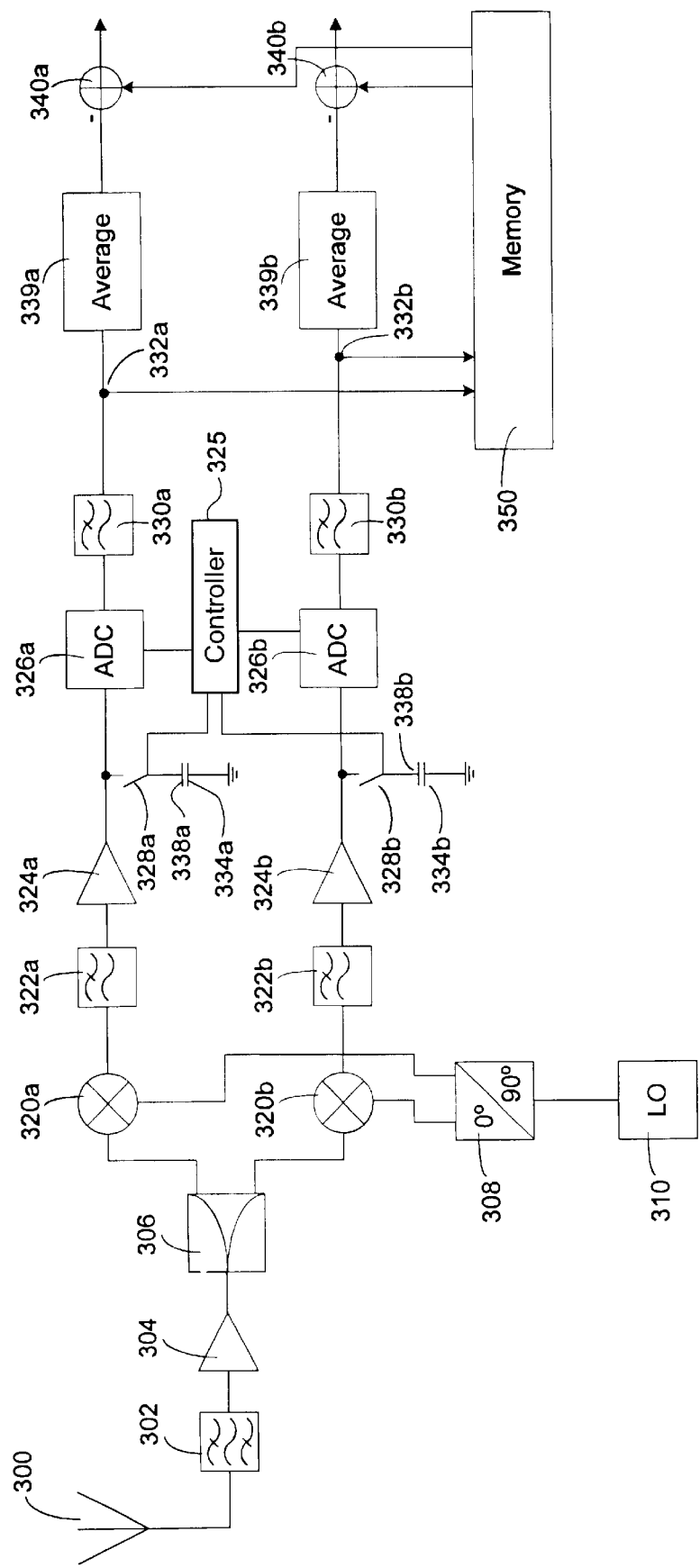
FIG. 3 is a schematic block diagram of a second alternative embodiment of the present invention.

FIG. 3 illustrates another alternative embodiment of the present invention. Just like FIGS. 1 and 2, all components in FIG. 3 with a reference numeral, the last two digits of which correspond to the last two digits of a corresponding component in the prior art receiver of FIG. 4, are identical or have essentially the same function. Contrary to the embodiments of FIGS. 1 and 2, the alternative embodiment of FIG. 3 solves the problem in the analog domain rather than the digital domain; an integrator comprising a capacitor 334a–b and a selector 328a–b filters out the DC level of the analog signal and stores the result as a voltage across the capacitor 334a–b. Controller means 325 is arranged to detect the presence of the last wanted digital data symbol at the AD converter 326a–b and to control the selector 328a–b to switch from a first state, where the selector 328a–b is open and the capacitor 334a–b is disconnected from the first and second signal paths respectively, to a second state, where the selector 328a–b is closed and the capacitor 334a–b is connected to the first and second signal paths, respectively, between the amplifier 324a–b and the AD converter 326a–b. When the selector 328a–b is in its second state, the output 338a–b of the respective capacitor 334a–b is supplied to the digital filter 330a–b through the respective AD converter 326a–b, so that the digital filter 330a–b is supplied with a signal with no rapid change in DC level immediately after the last wanted digital symbol has been sampled by the AD converter 326a–b. The receiver components prior to the capacitor 334a–b and selector 328a–b, i.e., amplifier 324a–b, lowpass filter 3223a–b, etc., may be turned off or switched to a passive/idle mode at the same time.

The invention has been described above with reference to preferred and alternative embodiments. This disclosure has exemplifying but not limiting purposes; the scope of the present invention is only limited by the definitions in the appended independent patent claims. In particular, the present invention is equally applicable also to other receiver types not mentioned herein, such as receivers having other than two channels or signal paths and/or employing more than one digital filter per signal path.

What is claimed is:

1. A communication signal receiver for enabling switching from an active mode to a passive mode in order to reduce power consumption, the receiver comprising:
   a plurality of components arranged along at least one signal path, the components along the signal path comprising a filter for processing a received signal and averaging means for deriving a mean value of the signal,
   wherein an output of the averaging means is connected to a selector located prior to the filter along the signal path, and
   control means in communication with the selector, the control means for detecting an event in the signal indicative of a last data symbol and responsive thereto controlling the selector so as to cause the selector to supply the mean value comprising a DC level to the filter in response to detection of the event in the signal so as to enable components arranged prior to the selector along with signal path to be switched from the active mode to the passive mode.

2. A communication signal receiver according to claim 1, wherein an input of the averaging means is connected to an output of the filter, and wherein the filter comprises a digital filter.

3. A communication signal receiver according to claim 1, wherein an input of the averaging means is connected to the selector (228a–b) located prior to the filter (230a–b) along the signal path.

4. A communication signal receiver according to claim 1, wherein said selector comprises:
   a selector input operatively connected to the output of the averaging means; a selector output operatively connected to an input of the filter; and a selector control terminal operatively connected to counter means for controlling whether data received at the selector input is to be supplied at the selector output.

5. A communication signal receiver according to claim 1, further comprising an A/D converter for converting a received analog signal to a digital signal.

6. A communication signal receiver according to claim 5, wherein the averaging means (134a–b) is located after the A/D converter along the signal path.

7. A communication signal receiver according to claim 5, wherein the averaging means (334a–b) is located prior to the A/D converter along the signal path.

8. A communication signal receiver according to claim 7, wherein the averaging means (334a–b) comprises a capacitor.

9. A method of operating a communication signal receiver with a plurality of components arranged along at least one signal path, wherein a received signal is converted to digital form and is processed by at least one digital filter in said plurality of components, in a manner so as to enable switching from an active mode to a passive mode, the method comprising:
   determining an average value comprising a DC level of the signal;
   detecting an event in the signal indicative of a last data symbol; and
   in response to detecting said event, feeding said at least one digital filter with said average value comprising the DC level in order to enable switching of component(s) arranged prior to the selector from the active mode to the passive mode in order to reduce power consumption.

10. A method according to claim 9, wherein said event is the presence of a certain digital data symbol at a certain component (126*a–b*) prior to said digital filter (130*a–b*) along said signal path.

11. A communication signal receiver comprising:
- a plurality of components arranged along at least one signal path, the components along the signal path comprising a digital filter for processing a received signal and averaging means located downstream of the filter for deriving a mean value of the signal,
- wherein an output of the averaging means is connected via a feedback loop to a selector located prior to the filter along the signal path, and
- a controller in communication with the selector, the controller for detecting an event in the signal and causing the selector to supply the mean value to the filter in response to detection of the event in the signal so as to enable components located prior to the selector along the signal path to be switched from an active mode to a passive mode.

12. The receiver of claim 1, wherein the averaging means is located downstream of the filter, and an output of the averaging means is connected to the selector via a feedback loop.

13. The method of claim 9, wherein an averaging means is located downstream of the filter, and an output of the averaging means is connected to a selector via a feedback loop.

14. A communication signal receiver comprising:
- a plurality of components arranged along at least one signal path, the components along the signal path comprising a filter for processing a received signal and averaging means for deriving a mean value of the signal,
- wherein an output of the averaging means is connected to a selector located prior to the filter along the signal path, and
- control means in communication with the selector, the control means for detecting an event in the signal indicative of a last data symbol and responsive thereto controlling the selector so as to cause the selector to supply the mean value comprising a DC level to the filter in response to detection of the event in the signal.

15. A method of operating a communication signal receiver with a plurality of components arranged along at least one signal path, wherein a received signal is converted to digital form and is processed by at least one digital filter in said plurality of components, the method comprising:
- determining an average value comprising a DC level of the signal;
- detecting an event in the signal indicative of a last data symbol; and
- in response to detecting said event, feeding said at least one digital filter with said average value.

\* \* \* \* \*